United States Patent [19]

Eitrheim et al.

[11] Patent Number: 4,687,959

[45] Date of Patent: Aug. 18, 1987

[54] METHOD AND APPARATUS FOR ACCESS TO A PLA

[75] Inventors: John K. Eitrheim, Cedar Park; Ashok H. Someshwar, Austin, both of Tex.

[73] Assignee: Motorola, Inc., Schaumburg, Ill.

[21] Appl. No.: 845,283

[22] Filed: Mar. 27, 1986

[51] Int. Cl.$^4$ .......................................... H03K 19/096
[52] U.S. Cl. .................................. 307/465; 307/452; 307/469; 307/481; 307/269
[58] Field of Search ............... 307/443, 445, 452, 465, 307/468–469, 480–481, 527, 269, 272 R, 272 A; 364/716

[56] References Cited

U.S. PATENT DOCUMENTS

| | | | |
|---|---|---|---|
| 4,317,053 | 2/1982 | Shaw et al. | 307/452 X |
| 4,429,238 | 1/1984 | Harrison | 364/716 X |
| 4,469,964 | 9/1984 | Guttag et al. | 307/481 |
| 4,501,977 | 2/1985 | Koike | 307/469 |
| 4,508,977 | 4/1985 | Page et al. | 307/468 |
| 4,611,133 | 9/1986 | Peterson et al. | 307/469 X |
| 4,617,480 | 10/1986 | Au | 307/452 X |

FOREIGN PATENT DOCUMENTS

| | | | |
|---|---|---|---|
| 0121746 | 9/1980 | Japan | 307/465 |
| 0048834 | 3/1982 | Japan | 307/468 |

OTHER PUBLICATIONS

Balasubramanian et al, "Increasing Chip Density by Space Sharing of Programmed Logic Arrays", IBM TDB, vol. 20, No. 10, Mar. 1978, pp. 4016–4018.

Primary Examiner—Stanley D. Miller
Assistant Examiner—D. R. Hudspeth
Attorney, Agent, or Firm—John A. Fisher; Jeffrey Van Myers; Jonathan P. Meyer

[57] ABSTRACT

Improved access to programmable logic arrays is provided by continuously asserting and negating a latch inputs control signal, continuously asserting and negating a control signal which discharges a first logic section of the array to provide frequent, current inputs to a second logic section of the PLA and discharging the second section of the PLA only upon receipt of an access request. In the case of asynchronous access, it is also necessary to generate a synchronized data strobe from the unsynchronized one and to generate an acknowledge signal to indicate the presence of valid output data. The disclosed method and apparatus provide access which has a short access time and which also provides outputs which reflect relatively current states of the inputs thereto.

18 Claims, 3 Drawing Figures

METHOD AND APPARATUS FOR ACCESS TO A PLA

FIELD OF THE INVENTION

The present invention relates, in general, to a method and apparatus for accessing programmable logic arrays (PLA's) in the context of a speed-critical system. More particularly, the invention relates to a method and apparatus which provide for very fast access to a PLA and to ensure that the output data represents recent states of inputs thereto.

BACKGROUND OF THE INVENTION

PLA's are widely used in digital systems to provide fixed logic functions at relatively low cost. For instance, a PLA may be fabricated as a portion of a larger circuit to provide certain logic functions.

A two level PLA comprises, in addition to various control and other functions, two separate logic arrays. For instance, a first logic array may comprise an array of AND functions (which may or may not be actually implemented with AND gates) and a second logic array may comprise an array of OR functions. As is familiar in the art, one "programs" such a device by means of choosing the interconnections between the various functions.

In a typical two-level PLA, logical inputs are first provided to the AND array (also referred to as the product section because of the identity between the Boolean AND and the logical product functions). The outputs of the product section are provided to the OR array (also referred to as the sum section). The outputs of the sum section are taken as the outputs of the PLA.

Access to such a two-level PLA requires several steps. First, the inputs on the data must be latched for input to the product section. Next, the product section must be instructed to process those inputs, commonly referred to as discharging the product section. Next, the sum section must be similarly discharged to process the outputs of the product section. Finally, a signal must be generated indicating that the outputs of the PLA are now valid data.

In a system in which access to the PLA is a critical factor in the performance of the system, two parameters describing access to the PLA are useful. First, it is desirable that the time between the requested access to the PLA and the output of valid data be as small as possible. This parameter will be referred to as access time and will be more rigorously defined hereinbelow. In addition, in a system in which the inputs to the PLA may be changing rapidly, it is desirable that the outputs reflect as recent a state of the inputs as possible. This parameter will be referred to as the age of the response and will be more rigorously defined below.

For purposes of clarity, several definitions will be helpful. When a signal is said to be asserted, it shall be deemed to mean that the signal is made to be active, whether this implies that it is high or low. When a signal is said to be negated, this shall be deemed to mean that the signal is made inactive, whether this implies that it is high or low.

SUMMARY OF THE INVENTION

Accordingly, it is an object of the present invention to provide an improved method and apparatus for providing access to a PLA.

It is a further object of the present invention to provide a method and apparatus for access to a PLA which minimizes the time between requested access to the PLA and the output of valid data.

Yet a further object of the present invention is to provide a method and apparatus for access to a PLA which provides valid output data reflecting as nearly as possible the most recent state of the inputs to the PLA.

These and other objects and advantages of the present invention are provided by a PLA comprising a plurality of input latches, a first logic array having inputs coupled to said input latches, a second logic array having inputs coupled to said first logic array; the input latches, first logic array and second logic array being controlled by latch inputs, discharge first array and discharge second array control signals, respectively, and a control logic section for receiving an access request and for producing the latch inputs, discharge first array and discharge second array signals. The latch inputs signal is asserted and negated continuously in synchrony with the PLA clock unless the access request signal (data strobe) is active, in which case the latch inputs signal is not active. The discharge first array signal is similarly asserted and negated continuously (alternatively with respect to the latch inputs signal) unless the access request data strobe is active, in which case the discharge first array signal is active. The discharge second array signal is asserted a predetermined time after the access request data strobe goes active and negated a predetermined time thereafter. A predetermined time after the assertion of the discharge second array signal, the acknowledge signal is asserted to indicate that the data at the outputs of the PLA is valid.

These and other objects and advantages of the present invention will be apparent to one skilled in the art from the detailed description below taken together with the drawings.

DETAILED DESCRIPTION OF THE INVENTION

The particular embodiment of the present invention described below with respect to FIGS. 1-3 involve asynchronous access to a PLA. In other words, the clock controlling the outside circuits making use of the PLA is not synchronized to the clock controlling the PLA. This example is described in detail because it is the most general case, but is not intended to so limit the present invention. At various points throughout the description, reference will be made to modifications to the described system which would make it useful for synchronous access.

Figure 1:
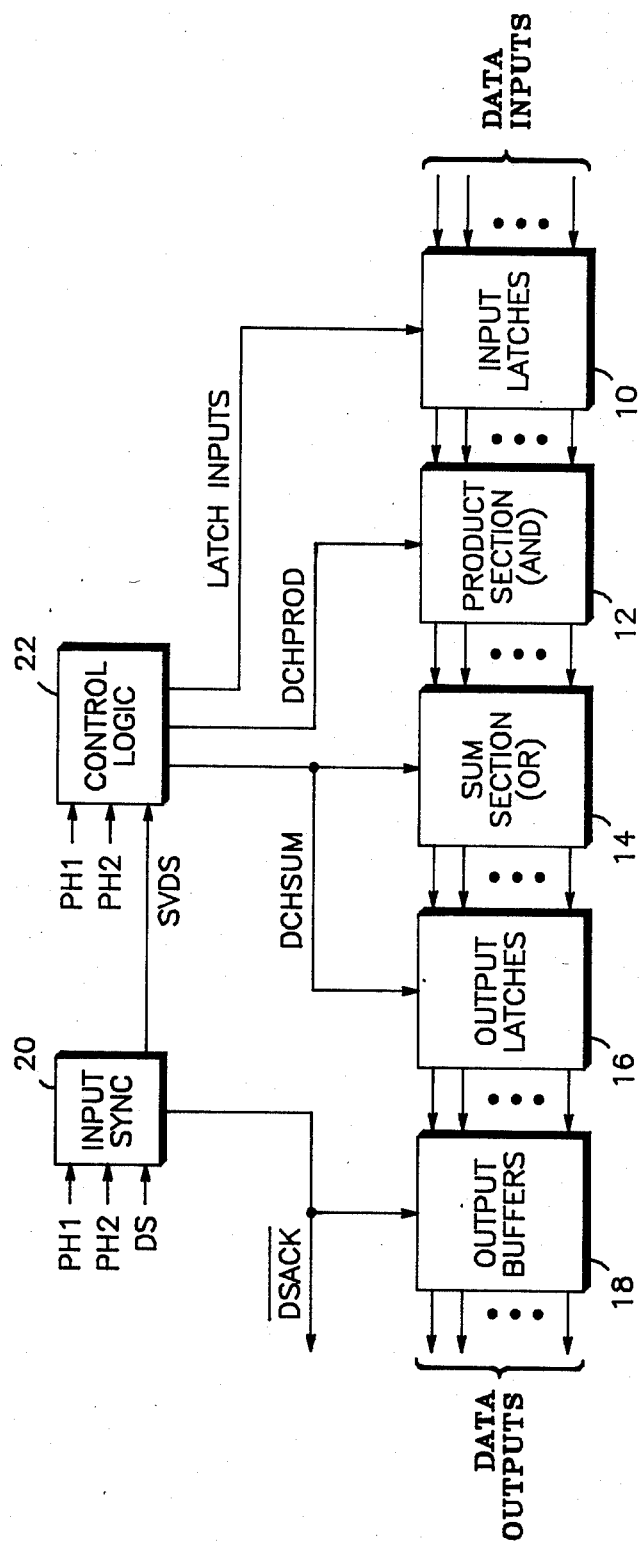
FIG. 1 is a block diagram illustrating an asynchronous access PLA according to a particular embodiment of the present invention.

FIG. 1 is a block diagram illustrating the basic functional units of an asynchronous access, two-level PLA according to the principles of the present invention. Input data carried on a plurality of data lines are provided to a like plurality of input latches 10. Input latches 10 are controlled by a LATCH INPUTS control signal to latch the input data. The first of two logic arrays comprises product section 12, which has a plurality of inputs coupled to input latches 10. Product section 12 further comprises a plurality of Boolean AND functions, implemented in any of a number of familiar logic forms, which have been interconnected in a predetermined manner to provide a desired logical function or functions. A DCHPROD control signal triggers product section 12 to process the data currently held by input latches 10, otherwise known as discharging the product section.

The second of the two logic arrays comprises a sum section 14 which has a plurality of inputs coupled to the outputs of product section 12. Sum section 14 further comprises a plurality of Boolean OR functions, implemented in any of a number of familiar logic forms, which have been interconnected in a predetermined manner to provide a predetermined logical function or functions. A DCHSUM control signal triggers sum section 14 to discharge, or process the data appearing at its inputs.

A plurality of output latches 16 have inputs coupled to the outputs of sum section 14. The control signal DCHSUM is also used to trigger output latches 16 to latch the data appearing at the outputs of sum section 14. The outputs of output latches 16 are, in turn, coupled to a plurality of output buffers 18 which serve to drive a plurality of output lines.

The control structure of the PLA of FIG. 1 comprises an input synchronizer 20 and a control logic section 22, both input synchronizer 20 and control logic 22 have inputs coupled to a PLA clock signal which, in this case, comprises a two phase signal PH1 and PH2. Since this embodiment of the present invention involves asynchronous access, clock signals PH1 and PH2 are not synchronized with the external clock which controls, for instance, the timing of the presentation of the access request to synchronizer 20.

An unsynchronized data strobe signal DS is input to synchronizer 20 indicating that the external system wishes to initiate access to the PLA. A primary function of input synchronizer 20 is to provide a synchronized data strobe signal SVDS which is synchronized to the clock signals PH1 and PH2 and can be utilized to control the PLA. In addition, input synchronizer 20 produces an acknowledge signal DSACK which indicates to the external system making use of the PLA that the output data is valid and is also used to control output buffers 18.

Synchronized data strobe signal SVDS produced by input synchronizer 20 is coupled to an input of control logic section 22. From the PLA clock signals PH1 and PH2 and the synchronized data strobe signal SVDS, control logic 22 produces the control signals LATCH INPUTS, DCHPROD and DCHSUM.

Figure 2:
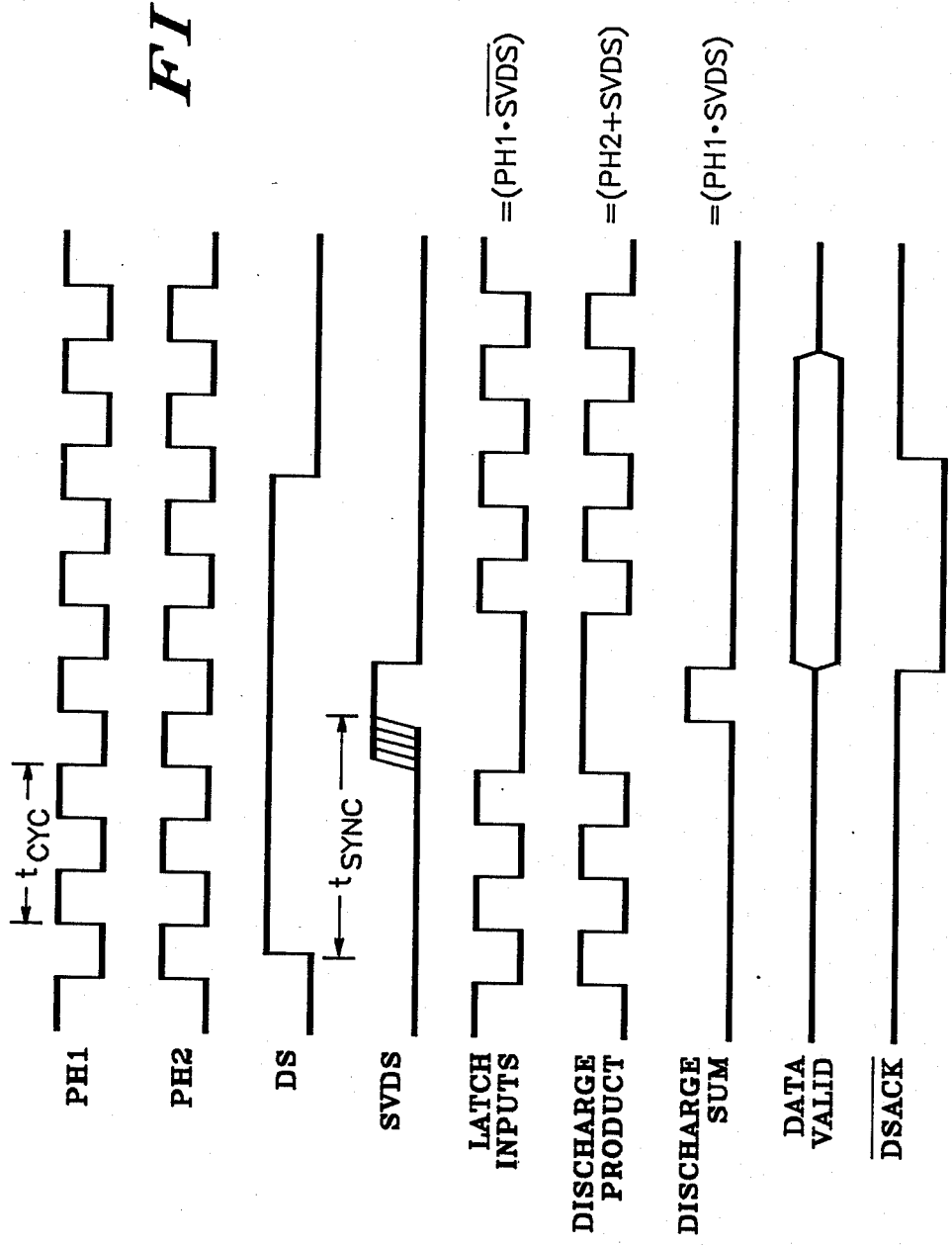
FIG. 2 is a timing diagram illustrating the operation of the apparatus of FIG. 1.

Referring now to FIG. 2, the timing of the system of FIG. 1 is described. The top two waveforms of FIG. 2 correspond to the two phase clock signals PH1 and PH2. As is familiar in the art, these two clock signals are 180 degrees out of phase and define a clock having a period $t_{cyc}$. The third waveform corresponds to the unsynchronized data strobe signal DS which is received by the PLA at some arbitrary time not related to the phase of clock signals PH1 and PH2.

After a synchronization period $t_{sync}$, which is determined by the design of the synchronizer being used, input synchronizer 20 (FIG. 1) produces SVDS, which is shown as the fourth waveform of FIG. 2. As is shown in FIG. 2, the synchronizer (see FIG. 3) is resolving while PH2 is active and is assumed to be active before the subsequent rising edge of PH1. For present purposes, it will be assumed that SVDS is asserted coincident with a rising edge of PH1. As will be apparent to one skilled in the art, if the system being described were a synchronous one, the external data strobe DS would be synchronized. Therefore, the operation of a synchronous system according to the principles of the present invention may be understood by thinking of SVDS as a synchronized data strobe received from the external system.

The synchronization period $t_{sync}$ obviously has an effect on the total response time of the system being described. However, $t_{sync}$ can vary widely depending on synchronizer design and would not even be present in the timing of a synchronous access system. Therefore, in the interest of generality, the access time and age of response definitions will be made independent of $t_{sync}$. Access time is defined as the time from the assertion of SVDS to the assertion of DSACK (see the last waveform of FIG. 2). As is apparent, this parameter measures, independent of $t_{sync}$, the time period from a requested PLA access to the output of valid data. The age of response parameter is defined as the time between the latching of the input data (which occurs in this system when LATCH INPUTS is negated) and the assertion of DSACK. Since any changes in the input data which occur after the inputs are latched will not be reflected in the output data, this parameter measures the degree to which the PLA output reflects recent input data.

Following SVDS in FIG. 2, the next waveform corresponds to the LATCH INPUTS control signal generated by the control logic section to control the input latches. As shown, this control signal is continuously asserted and negated in synchrony with the PLA clock signals except during the period when SVDS is active. In fact, LATCH INPUTS can be described as the logical product of PH1 and the inverse of SVDS (PH1·$\overline{\text{SVDS}}$). Thus, the input data is constantly being updated in case an access request is received. In the particular system being described, the input data is changing while PH1 is active, so the input data is actually latched on the falling edge of LATCH INPUTS, so as to be current as possible. As will be apparent to one skilled in the art, it is necessary to properly phase the LATCH INPUTS control signal with respect to the changing of the inputs so that the contents of the input latches are as current as possible.

The next waveform of FIG. 2 corresponds the DCHPROD control signal which triggers the discharge of the first, or product section, of the PLA. As is apparent, this control signal is also continuously asserted and negated in synchrony with the clock signals, except when SVDS is active, in which case DCHPROD is also active. DCHPROD is in phase with PH2, as opposed to LATCH INPUTS, which is in phase with PH1. In fact, DCHPROD can be expressed as the logical sum of PH2 and SVDS (PH2+SVDS). Discharging the product section on every clock cycle assures that current outputs of the product section are ready for input to the sum section of the PLA on every clock cycle.

The next waveform of FIG. 2 corresponds to the DCHSUM control signal which triggers the discharge of the sum section of the PLA. DCHSUM is asserted in response to the assertion of SVDS and negated shortly thereafter. DCHSUM may be expressed as the logical product of PH1 and SVDS (PH1·SVDS). In other words, the sum section of the PLA is discharged only in response to the access request, as opposed to the product section, which is continuously discharged as described above.

The bottom waveform of FIG. 2 corresponds to DSACK, the signal produced by the PLA to indicate to the external system that the output data is valid. As shown on the waveform immediately above DSACK, the assertion of DSACK corresponds to the beginning of the period during which the output of the PLA represents valid data. The assertion of DSACK coincides with the negation of DCHSUM.

In a typical asynchronous system, the portion of the system which is external to the PLA will respond to the assertion of DSACK by reading the data on the output data lines. Once this has been completed, the PLA access will be terminated by the negation, by the external system, of DS. Shortly thereafter, the PLA synchronizer control logic will negate DSACK, as shown in FIG. 2. To ensure accurate reading of the data by the external system, the data remains valid until after DS and DSACK have been negated.

By examination of FIG. 2, it is possible to determine the values of the access time and age of response parameters provided by the described system, in terms of the PLA clock period. From the rising edge of PH1 on which SVDS is asserted until the point at which DSACK is asserted, a period of one-half $t_{cyc}$ transpires. Therefore, access time is one-half $t_{cyc}$. From the falling edge of PH1 on which the inputs are last latched to the assertion of DSACK, a period of one $t_{cyc}$ transpires. Therefore, the age of response is one $t_{cyc}$.

It can be shown that several alternatives to the present invention provide less desirable performance in terms of access time and age of response. If the inputs are continuously latched, but both the product and sum sections are discharged only in response to an access request, the access time would be one $t_{cyc}$ and the age of response would be one $t_{cyc}$. Another alternative involving continuously latching inputs, discharging the product section and discharging the sum section, is somewhat more complicated. In a best case scenario in which the access request is received at an opportune moment, the access time would be zero and the age of response would be 1.5 $t_{cyc}$. In another case, the access time would be one-half $t_{cyc}$ and the age of response would be one $t_{cyc}$. Therefore, an average access time would be 0.25 $t_{cyc}$ and an average of response would be 1.25 $t_{cyc}$.

The latter of the above-described alternatives would be attractive but for an important drawback. That is, in order to ensure that new input data is always latched, it is required that the external data strobe DS be inactive for a period of two $t_{cyc}$ after an access or wait two $t_{cyc}$ to assert DSACK. Adding this required quiescent period to the average access time results in 2.25 $t_{cyc}$, which is unacceptably long in some situations.

Figure 3:
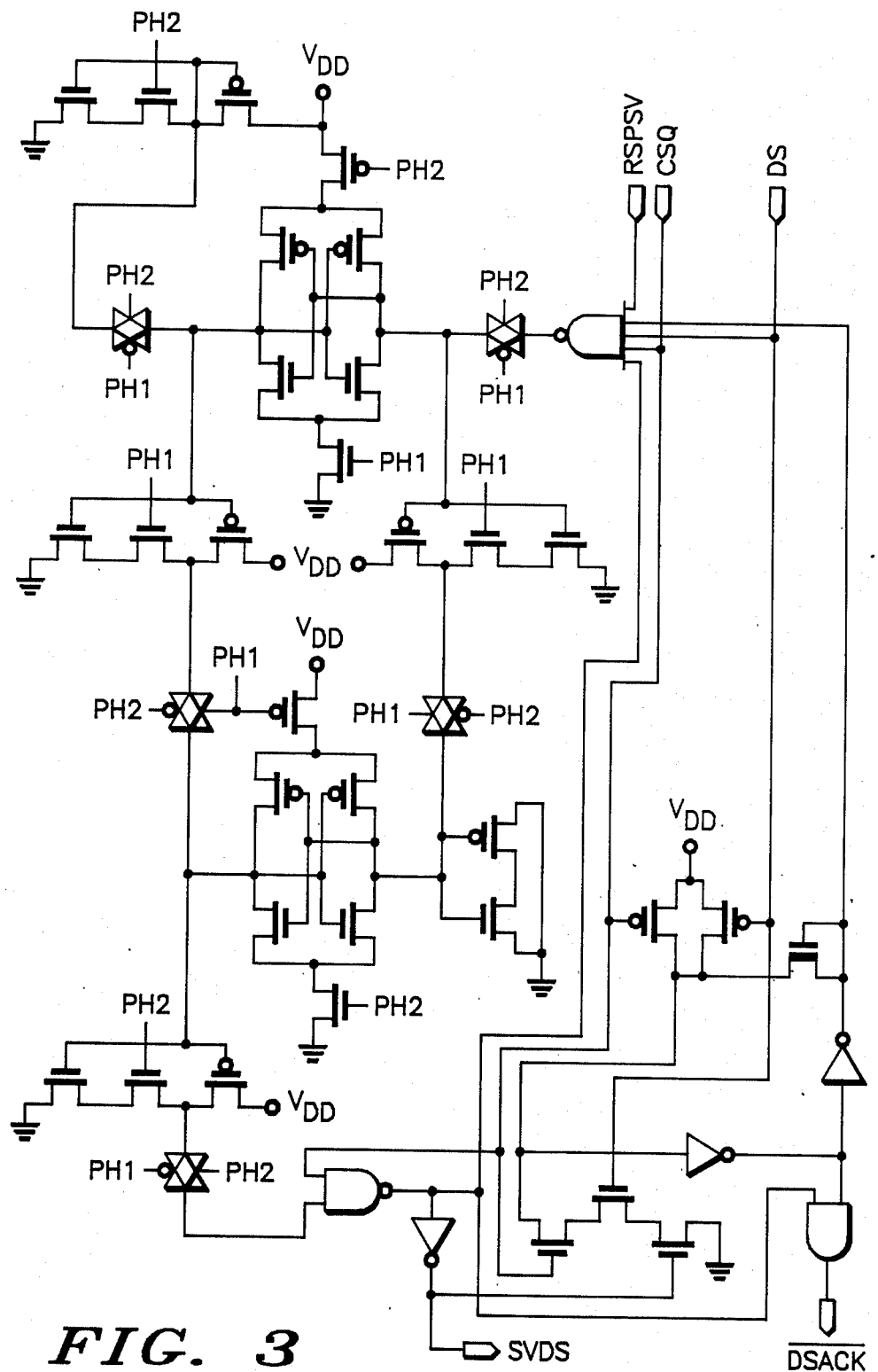
FIG. 3 is a circuit diagram illustrating one method of implementing a portion of the apparatus of FIG. 1.

FIG. 3 is a detailed schematic diagram illustrating one method of implementing the synchronizer apparatus of FIG. 1. The circuit shown receives inputs of PH1, PH2, DS, CSQ and RSPSV. The latter of the above are chip select and address signals, respectively. The circuit provides outputs of SVDS and DSACK according to the timing diagram of FIG. 2. Since LATCH INPUTS, DCHPROD and DCHSUM are derived so easily from PH1, PH2 and SVDS, the logic necessary to implement these functions is not shown. Since one skilled in the art could arrive at many different circuit implementations of the functions described above, this particular implementation will not be discussed in detail. One particular advantage of this implementation is that it is capable of responding to a second DS input very shortly after a previous response cycle is complete.

The apparatus and method described hereinabove provide improved access to a PLA. Specifically, the method and apparatus described provide PLA access which minimizes both access time and age of response parameters.

Various modifications and changes to the present invention as embodied in the particular example described above will be apparent to one skilled in the art and are within the spirit and scope of the present invention.

We claim:

1. A programmable logic array having a plurality of inputs and a plurality of outputs comprising:
   a plurality of input latches coupled to said plurality of inputs;
   a first logic section having inputs coupled to said input latches;
   a second logic section having inputs coupled to outputs of said first logic section and having outputs coupled to said plurality of outputs; and
   control means for receiving at least one clock signal and a strobe signal and for producing a latch input signal to operate said plurality of input latches, a first discharge signal to operate said first logic section and a second discharge signal to operate said second logic section, said latch inputs signal being asserted and negated continuously in synchrony with said at least one clock signal except when said strobe signal is active, said first discharge signal being asserted and negated continuously in synchrony with said at least one clock signal except when said strobe signal is active and said second discharge signal being asserted and negated in response to said strobe signal.

2. A programmable logic array according to claim 1 wherein:
   said strobe signal corresponds to an external access request signal and is synchronized to said at least one clock signal.

3. A programmable logic array according to claim 1 further comprising:
   synchronizer means coupled to said control means for receiving said at least one clock signal and an unsynchronized strobe signal corresponding to an external access request signal and for producing said strobe signal synchronized to said at least one clock signal and an acknowledge signal a predetermined length of time thereafter.

4. A programmable logic array according to claim 3 wherein:
   said at least one clock signal comprises a two phase clock, said latch inputs signal being asserted and negated in phase with one of said clock phases and said first discharge signal being asserted and negated in phase with the other of said clock phases.

5. A programmable logic array according to claim 4 wherein:
   said latch inputs signal is equivalent to a logical product of said one phase of said clock signal and an inverse of said strobe signal.

6. A programmable logic array according to claim 4 wherein:

said first discharge signal is equivalent to a logical sum of said other phase of clock signal and said strobe signal.

7. A programmable logic array according to claim 4 wherein said second discharge signal is equivalent to a logical product of said one phase of said clock signal and said strobe signal.

8. A programmable logic array according to claim 2 wherein:
said at least one clock signal comprises a two phase clock, said latch inputs signal being asserted and negated in phase with one of said clock phases and said first discharge signal being asserted and negated in phase with the other of said clock phases.

9. A programmable logic array according to claim 8 wherein:
said latch inputs signal is equivalent to a logical product of said one phase of said clock signal and an inverse of said strobe signal.

10. A programmable logic array according to claim 8 wherein:
said first discharge signal is equivalent to a logical sum of said other phase of said clock signal and said strobe signal.

11. A programmable logic array according to claim 8, wherein:
said second discharge signal is equivalent to a logical product of said one phase of said clock signal and said strobe signal.

12. A method of operating a programmable logic array of the type comprising a plurality of inputs, a plurality of input latches coupled to said plurality of inputs, a first logic section having inputs coupled to said input latches, a second logic section having inputs coupled to outputs of said first logic section and a plurality of outputs coupled to outputs of said second logic section comprising the steps of:
asserting and negating control signals to said input latches and said first logic section continuously in synchrony with a clock signal;
receiving a strobe signal synchronized to said clock signal;
halting the assertion and negation of said control signals to said input latches and said first logic section while said synchronized strobe signal is active, said control signal to said input latches being inactive and said control signal to said first logic section being active; and
asserting and negating a control signal to said second logic section while said synchronized strobe signal is active.

13. A method according to claim 12 further comprising the steps of:
receiving a strobe signal unsynchronized to said clock signal; and
producing said synchronized strobe signal in response to said unsynchronized strobe signal.

14. A method according to claim 13 further comprising the steps of:
producing an acknowledge signal after asserting said control signal to said second logic section.

15. A method according to claim 13 wherein said clock signal comprises a two phase clock and wherein said step of asserting and negating control signals to said input latches and said first logic section further comprises the steps of:
producing a control signal for said input latches equivalent to the logical product of one of said clock phases and an inverse of said synchronized strobe signal; and
producing a control signal for said first logic section equivalent to the logical sum of the other of said clock phases and said synchronized strobe signal.

16. A method according to claim 13 wherein said clock signal comprises a two phase clock and wherein said step of asserting and negating a control signal to said second logic section further comprises the step of:
producing a control signal for said second logic section equivalent to a logical product of said one phase of said clock signal and said synchronized strobe signal.

17. A method according to claim 12 wherein said clock signal comprises a two phase clock and wherein said step of asserting and negating control signals to said input latches and said first logic section further comprises the steps of:
producing a control signal for said input latches equivalent to the logical product of one of said clock phases and an inverse of said synchronized strobe signal; and
producing a control signal for said first logic section equivalent to the logical sum of the other of said clock phases and said synchronized strobe signal.

18. A method according to claim 12 wherein said clock signal comprises a two phase clock and wherein said step of asserting and negating a control signal to said second logic section further comprises the step of:
producing a control signal for said second logic section equivalent to a logical product of said one phase of said clock signal and said synchronized strobe signal.

* * * * *